United States Patent
Ishibashi (10) Patent No.: US 6,365,009 B1
(45) Date of Patent: *Apr. 2, 2002

(54) COMBINED RF-DC MAGNETRON SPUTTERING METHOD

(75) Inventor: Keiji Ishibashi, Tama (JP)

(73) Assignee: Anelva Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/071,446

(22) Filed: May 1, 1998

(30) Foreign Application Priority Data

Jun. 17, 1997 (JP) .............................................. 9-176431

(51) Int. Cl.[7] .............................................. C23C 14/35
(52) U.S. Cl. .............................. 204/192.12; 204/192.13
(58) Field of Search ....................... 204/192.12, 192.13, 204/298.03, 298.08

(56) References Cited

U.S. PATENT DOCUMENTS

| | | | |
|---|---|---|---|
| 4,874,494 A | * 10/1989 | Ohmi | 204/192.12 |
| 4,950,956 A | 8/1990 | Asamaki et al. | 315/111.21 |
| 5,303,139 A | * 4/1994 | Mark | 363/63 |
| 5,310,452 A | * 5/1994 | Doki et al. | 156/643 |
| 5,415,757 A | * 5/1995 | Szcyrbowski et al. | 204/298.08 |
| 5,423,970 A | * 6/1995 | Kugler | 204/298.03 |
| 5,573,597 A | * 11/1996 | Lantsman | 118/723 MP |
| 5,693,197 A | * 12/1997 | Lal et al. | 204/192.2 |

FOREIGN PATENT DOCUMENTS

| | | | |
|---|---|---|---|
| JP | 6-349746 | 12/1994 | H01L/21/205 |
| JP | 7-224379 | 8/1995 | C23C/14/34 |
| JP | 7-243039 | 9/1995 | C23C/14/35 |
| JP | 8-222398 | 8/1996 | H05H/1/46 |
| JP | 8-311645 | 11/1996 | C23C/14/38 |
| JP | 9-217171 | * 8/1997 | C23C/14/40 |

OTHER PUBLICATIONS

English translation of JP 7–224379, Aug. 1995.*

"Simultaneous in situ measurements of properties of particles in rf silane plasmas using a polarization–sensitive laser–light–scattering method," M. Shiratani et al, J. Appl. Phys. vol. 79 (1) Jan. 1996, pp. 104–109.

Shiratani, M. et al, "Simultaneous in Situ Measurements of Properties of Particulates in rf Silane Plasmas Using a Polarization–Sensitive Laser–Light–Scattering Method," *J. Appl. Phys.*, vol. 79, No. 1, pp. 104–109, Jan. 1996.

* cited by examiner

*Primary Examiner*—Nam Nguyen
*Assistant Examiner*—Steven H. VerSteeg
(74) *Attorney, Agent, or Firm*—Cook, Alex, McFarron, Manzo, Cummings & Mehler, Ltd.

(57) ABSTRACT

A combined RF-DC magnetron sputtering method stops the production of tracking arcs and promotes the consistent manufacture of thin films during the manufacture of thin films by such RF-DC magnetron sputtering. Magnets 121, 122 are placed behind the target 111. RF and DC power are simultaneously supplied to the target to produce a plasma, and sputtering is used to manufacture a thin film on a substrate 106 facing the target. The supply of RF and DC power to the target is simultaneously and periodically stopped. The time that the power is supplied is shorter than the time needed to produce tracking arcs. The RF and DC power is both supplied and stopped simultaneously, and RF and DC power is intermittently supplied to the target.

12 Claims, 5 Drawing Sheets

COMBINED RF-DC MAGNETRON SPUTTERING METHOD

FIELD OF INDUSTRIAL UTILIZATION

The present invention relates to a method for manufacturing thin films, and in particular to a process of manufacturing thin films using the combined RF (Radio Frequency)-DC (Direct Current) magnetron sputtering method. In this invention, the supply of power is improved to prevent a tracking arc from being produced and to ensure the consistent manufacture of thin films.

BACKGROUND OF THE INVENTION

Sputtering is an indispensable technique for depositing films typical used in electronic device manufacturing processes, and is widely known as a dry process technique with a wide range of applications. Sputtering is a method in which a rare gas such as argon is introduced into a vacuum container. Direct current (DC) or radio frequency (RE) power is supplied to a cathode including a target to produce a glow discharge and thereby deposit a film. The former is referred to as DC sputtering, while the latter is referred to as RF sputtering.

Figure 6:
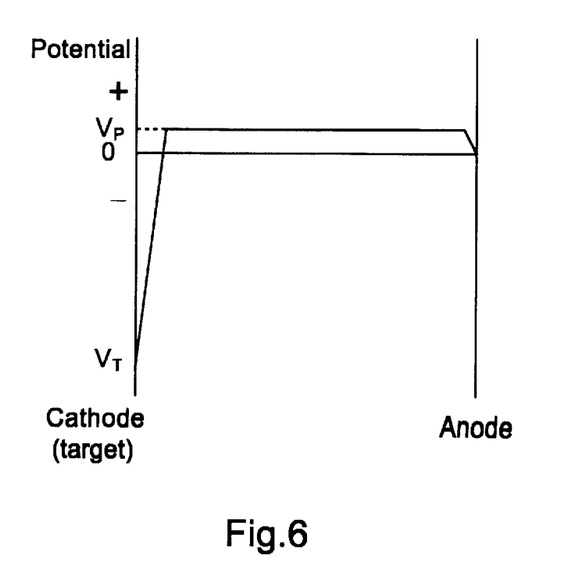
FIG. 6 depicts the potential distribution between the cathode surface (target surface) and anode (ground potential) during discharge.

FIG. 6 schematically depicts the potential distribution between the cathode and anode (ground potential) during discharge. Vp is the plasma time-averaged potential, and Vt is the cathode surface (that is, target surface) time-averaged potential. As shown in the figure, the resulting Vt of glow discharge is a negative potential with respect to the Vp. As a result of the difference in potential (Vp−Vt: referred to as self bias in the case of RF sputtering), positive ions such as those of accelerated argon collide with the surface of the target, which is attached to the cathode, and the target is sputtered. Sputtered particles from the target build up on a treatment piece (substrate) facing the target. When a mixed gas of a rare gas such as argon and a reactive gas such as $O_2$ or $N_2$ is introduced into the vacuum container at this time, the reaction product of the target material and this reactive gas builds up on the substrate.

The aforementioned sputtering includes magnetron sputtering, where magnets are placed behind the target to increase the plasma density around the target surface, resulting in more rapid film deposition. Magnetron sputtering includes RF magnetron sputtering using RF power, and DC magnetron sputtering using DC power. Both are widely used methods for depositing films during mass production.

There has been considerable progress in electronic devices recently, resulting in the need to develop techniques for improving thin film properties, including techniques for depositing films by magnetron sputtering. A factor which adversely affects the properties of thin films, when films are deposited by sputtering, is that the thin film is damaged by the impact of high energy particles on the substrate. The energy of these high energy particles is caused by differences in potential mainly arising on the front surface of the target. The difference in potential must be reduced to obtain high quality thin films. In the case of RF and DC magnetron sputtering, the Vt given in FIG. 6 is determined by the container configuration, pressure, magnetic field intensity, and the conditions of the power supply.

Another method is combined RF-DC magnetron sputtering, where RF and DC power are simultaneously supplied to the target to cause sputtering. The Vt can be controlled by the voltage of the DC power source supplying the DC power during combined RF-DC magnetron sputtering. A high quality thin film can thus be manufactured because the difference in potential produced on the front surface of the target can be reduced by increasing Vt during combined RF-DC magnetron sputtering.

However, one problem with sputtering is that an abnormal discharge is produced on the target or on the surface of other parts inside the vacuum container. More specifically when an ITO transparent conductive film consisting of In (indium), Sn (tin), and O (oxygen) is formed on a substrate using an In and Sn oxide as a target by magnetron sputtering, or when a GeSbTe phase change type of recording film is deposited on a substrate using a Ge (germanium), Sb (antimony), and Te (tellurium) compound as the target (general composition: $Ge_2Sb_2Te_5$), an abnormal discharge with rotating arcing is produced in portions on the target where the magnetic field perpendicular to the target surface is zero (that is, the portion where the target is mostly etched). Such an abnormal discharge is referred to as a "tracking arc" here. A tracking arc is not unusual even when using combined RF-DC magnetron sputtering which capable of manufacturing high quality thin films.

When a tracking arc is produced, the discharge impedance changes, and power cannot be supplied efficiently to the target. As a result, the film is formed at a lower rate, or films cannot be completely deposited. In some cases, a tracking arc results in the deposition of films with completely different properties.

A tracking arc also causes dust particles to be produced. When such dust particles adhere to the substrate, defects and product imperfections result.

A tracking arc is less readily produced when the magnetic field intensity at the target surface is weakened, when the film depositing pressure is lowered, and when the power supplied is reduced. However, a tracking arc cannot be completely suppressed by such methods. Such methods also cause production problems by lowering the film deposition rate.

An object of the present invention is to provide a thin film manufacturing method which suppresses a tracking arc and allows thin films to be consistently manufactured when such thin films are manufactured by combined RF-DC magnetron sputtering.

TECHNICAL ASPECTS OF THE INVENTION

Findings leading to the structure of the present invention as a means to achieving the aforementioned objectives will be discussed first.

The mechanism and causes of a tracking arc are not currently understood. The inventors conducted painstaking research to remedy the problem of a tracking arc in magnetron sputtering. As a result, they arrived at the following considerations on the mechanism and causes of a tracking arc.

It has been reported that in processes featuring the use of RF discharge, negatively charged clusters grow in the interface between the plasma and cathode sheath in the course of discharge. This is discussed, for example in the article by Shiratani et al in *J. Appl. Phys.* 79(1), (January 1996), pp. 104–109. This is attributed to cohesion with positively ionized free particles as a result of collision between negatively ionized free particles and high energy electrons of the g-electrons released from the cathode. The clusters which increase as a result of particle cohesion are negatively charged because of the increase in the collision area with the electrons. The negatively charged clusters and positive ions cohere further, and the clusters grow. The growth of the negatively charged clusters are considered a cause of the aforementioned tracking arc.

In the case of magnetron sputtering, most g-electrons and sputter particles are released in a part where target erosion is deepest, and the g-electrons are trapped in the magnetic field produced by the magnets. Extremely large clusters thus continue to be negatively charged and grow over the part where target erosion is deepest. Once such cluster growth and "charging up" passes a certain level, an arc is produced between the cluster past the level first and the target. The target is ablated by this arcing, resulting in a plume (fuming). Pressure in the plume is high, and arcing persists through the concentration of discharged power. At this time, the plume acts as a current path, and the arc rotates in the part of deepest erosion because it behaves as a conductor through which flows the current moving in the magnetic field. The aforementioned tracking arc is an arc with such properties.

Because of the above, time is needed for cluster growth in the case of materials (such as ITO consisting of In and Sn oxides, or $Ge_2Sb_2Te_5$, a compound of Ge, Sb, and Te) which have a high g-electron emission coefficient, are readily ablated, and tend to produce a plume. This is evident in light of the fact that a tracking arc was not produced at the same time that power began to be supplied (that is, at the initiation of discharge) during research.

Research demonstrated that no tracking arc was produced when the power supply was low. This suggests that plasma density is related to the production of a tracking arc. When the power supply is low, the plasma density is low, and the positive ion density therein is therefore low, allowing the growth of clusters to be suppressed. When the plasma density is low at the same time as this, the plasma-based shield weakens, and the negatively charged clusters are scattered by the electrostatic repulsion force due to mutual charge. Low power supply produces no tracking arc.

In the present invention, a time is established to suppress the growth of clusters and scatter them at a stage prior to the production of a tracking arc, thereby solving this problem.

The discharge should preferably be stopped to suppress the growth of clusters and scatter them. To suppress the growth of clusters and scatter them, the discharge need not necessarily be completely stopped. However, the power supply can be lowered to a certain level to lower the plasma density, allowing the cluster growth to be suppressed and scattered. A tracking arc can thus be prevented simply by lowering the power supply before the tracking arc is produced.

SUMMARY OF THE INVENTION

Based on the aforementioned findings, the present invention was constructed in the following manner.

In a first combined RF-DC magnetron sputtering method, the supply of the RF power and DC power to the aforementioned target is simultaneously and periodically stopped, and the aforementioned RF and DC power is supplied for a shorter time than the time needed for a tracking arc to be produced. That is, the supply and interruption of RF and DC power is synchronized, and power is thus intermittently supplied to the target. In the combined RF-DC magnetron sputtering method, magnets are placed behind the target, RF and DC power is supplied simultaneously to the target to produce a plasma, and sputtering is used to manufacture a thin film on a substrate facing the target.

In the first embodiment of the present invention, the period for suppressing the growth of clusters and scattering them is repeated by synchronizing and periodically managing the supply and interruption of RF and DC power to the target. The time for supplying power at this time is shorter than the time needed for the tracking arc to be produced, allowing such tracking arcs to be prevented.

Here, thin films are usually deposited by sputtering at a film forming pressure of about 0.1 to 1 Pa. When the initiation pressure of discharge is lower than the film depositing pressure, the supply of power may be discontinued for a longer time during the aforementioned intermittent supply of power to the target, making discharge possible when power is subsequently resumed, even when the discharge is completely stopped. However, depending on the device, for example, when the cathode (target) is of a small size, the initiation pressure of discharge is sometimes higher than the film depositing pressure. In such cases, when the power supply is interrupted for a longer time, and the discharge is completely interrupted, discharge can no longer be started at the film depositing pressure, even when power is then resumed. Accordingly, when the initiation pressure of discharge is thus higher than the film depositing pressure, it is better to avoid complete interruption of discharge without stopping the supply of power.

In a second combined RF-DC magnetron sputtering method, a period is established for simultaneously and periodically reducing the RF power and DC power supplied to the target, and the time in which the supplied power is supplied without being reduced is shorter than the time needed for a tracking arc to be produced.

In the second embodiment of the present invention, a period is set in order to lower, not completely stop, the supply of power to the target as in the first embodiment. The discharge is therefore not stopped, allowing discharge to be maintained at the film depositing pressure even when the initiation pressure of discharge is higher than the film depositing pressure. As is evident in light of the results of the research described above, lowering the power supplied to the target allows the plasma density to be reduced, and this allows the growth of clusters to be suppressed and scattered. The time when the power is supplied without being reduced is shorter than the time needed for a tracking arc to be produced, preventing a tracking arc in this method as well.

In a third combined RF-DC magnetron sputtering method, a constant voltage regulated power source is used for the DC power source supplying the DC power to the aforementioned target, and the set voltage of the constant voltage regulated power source is adjusted to no more than the voltage needed to maintain discharge (the lower absolute value) during discharge by DC power alone. Also, the supply of the RF power to the aforementioned target is periodically stopped, and the RF power supply time is shorter than the time needed for a tracking arc to be produced.

In the third embodiment of the present invention, the set voltage of the DC power is constant at no more than the voltage needed to maintain discharge (the lower absolute value) during discharge by DC power alone. The RF power supplied to the target is periodically stopped based on the constant DC voltage. If the set voltage of the constant voltage regulated power source is set to no more than the voltage needed to maintain discharge (the lower absolute value) during discharge by DC power alone, discharge takes place during the period in which RF power is supplied. Power is supplied from the constant voltage regulated power source as well, but no discharge can be maintained during the period in which no RF power is supplied, and no power is supplied from the constant voltage regulated power supply either. By periodically stopping the supply of RF power, power is supplied to the target for discharge, and the supply of power is stopped to stop discharge. A period can be set to suppress the growth of clusters and scatter them. The RE power is supplied for a shorter time than the time needed to produce a tracking arc so as to prevent the tracking arc from being produced in the same manner as in the first embodiment.

A fourth combined RF-DC magnetron sputtering method is based on the same assumptions as in the first embodiment of the present invention. A constant voltage regulated power source is used for the DC power source supplying the DC power to the target, and the set voltage of the constant voltage regulated power source is adjusted to no more than the voltage needed to maintain discharge (the lower absolute value) during discharge by DC power alone. A period is established for periodically reducing the RF power supplied to the target, and the time in which the aforementioned RF power is supplied without being reduced is shorter than the time needed for a tracking arc to be produced.

In the fourth embodiment of the present invention, the set voltage of the constant voltage regulated power source is set to no more than the voltage needed to maintain discharge (the lower absolute value) during discharge by DC power alone, so as to reduce the supply of RF power. This allows the plasma density to be reduced, and allows the growth of clusters to be suppressed and scattered. The period for suppressing and scattering cluster growth is set periodically, and the time when the RF power is supplied without being reduced is shorter than the time needed for a tracking arc to be produced. A tracking arc can be prevented by this method as well.

In another aspect of the invention for combined RF-DC magnetron sputtering method, the time for stopping the power supply or the time for reducing the power supply is at least 1 millisec. When the power supplied to the target is interrupted, the plasma is not instantaneously extinguished, but the density is gradually reduced. In the case of the commonly used sputtering gas argon, the time until the plasma density reaches almost zero after the supply of power has been stopped is about 1 msec. Even when the power supply has been reduced, it takes about 1 msec to reach a plasma density where the discharger is stable at the reduced power. In this embodiment of the present invention, a sufficient reduction in plasma density can be achieved by adjusting the time for stopping or reducing the power supply to at least 1 msec. This allows the growth of clusters to be suppressed and scattered, so that a tracking arc can be prevented from being produced.

BRIEF DESCRIPTION OF THE FIGURES

In describing the preferred embodiments of the present invention, reference is made to accompanying drawings wherein.

DETAILED DESCRIPTION OF PREFERRED EMBODIMENTS OF THE INVENTION

Preferred embodiments of the present invention are described below with reference to the attached drawings.

The structure of the combined RF-DC magnetron sputtering device (hereinafter referred to as sputtering "device") used for the combined RF-DC magnetron sputtering relating to the present invention is described with reference to FIG. 1. The sputtering device includes a vacuum container 101, a vacuum pump system 102 used to pump out the interior of vacuum container 101, and a gas feed system 103. A cathode 110 is provided at the bottom of the vacuum container 101. The cathode 110 comprises a target 111 and a backing plate 112 to which the target 111 is attached. A magnet assembly 120 for discharging the magnetron, comprising magnets 121 and 122 and a yoke 123, is placed behind the backing plate 112. The magnet 122 is the center magnet, and the magnet 121 is a circular magnet located around the center magnet. A substrate 106 and a susceptor 107 are placed at the top of the vacuum container 101.

An RF power supply system 130 consisting of an RF power source 131 and a matcher 132, and a DC power supply system 140 consisting of a DC power source 141 and a low pass filter 142 are connected to the cathode 110. A control device 151 controls the output of the RF power source 131 and DC power source 141, and 152 denotes a signal line from the control device. The vacuum container 101 is grounded. The cathode 110 is attached through an insulator 104 to the vacuum container 101. 105 denotes a target shield for preventing other parts of the backing plate 112 where the target 111 is located from being sputtered. The target 111 and backing plate 112 are set up with a slight interval (about 1 to 2 mm) between them.

An oscillating frequency of 13.56 MHz is used in the RF power source 131. In addition to the aforementioned structure, an apparatus suitable for actual use may also be provided with a water cooling mechanism for preventing the cathode 110 from being heated by sputtering, and a mechanism for taking out the substrate, but these have been omitted in FIG. 1 for the sake of simplicity.

A first embodiment of the combined RF-DC magnetron sputtering method related to the present invention using the aforementioned sputtering device is described below. In this method, a mixture of In and Sn oxides is used as the target 111 to form an ITO transparent conductive film on the substrate 106.

A sintered target (95% density) obtained by the addition of 10 wt % $SnO_2$ to $In_2O_3$ is used as the target 111. Over the target 111, the magnetic field intensity is, for example, about 300 Gauss parallel to the target while the magnetic field component perpendicular to the target surface (the upper surface of the target in FIG. 1) is zero. A mixed gas of $O_2$, mixed in a suitable amount (when ITO thin films are deposited by altering the amount of $O_2$ gas introduced, which is the amount resulting in the lowest film specific resistivity) with argon gas, is used for the sputtering gas. The film forming pressure is 0.4 Pa. Under these conditions, the desired time modulated power is supplied from the RF power source 131 and DC power source 141 to the target 111, based on the control device 151, to produce discharge.

A conventional combined RF-DC magnetron sputtering method, constant power is simultaneously output continuously from the RF power source 131 and DC power source 141 by means of the control device 151 to the target 111. In the case of conventional combined RF-DC magnetron sputtering featuring a continuous supply of such constant power, when the RF power density (supplied power divided by the target surface area) is 1.5 W/cm$^2$ and the DC power density is 0.5 W/cm$^2$, tracking arcs are produced in about 2 seconds in earlier cases and in about 2 minutes in longer cases.

Figure 2:
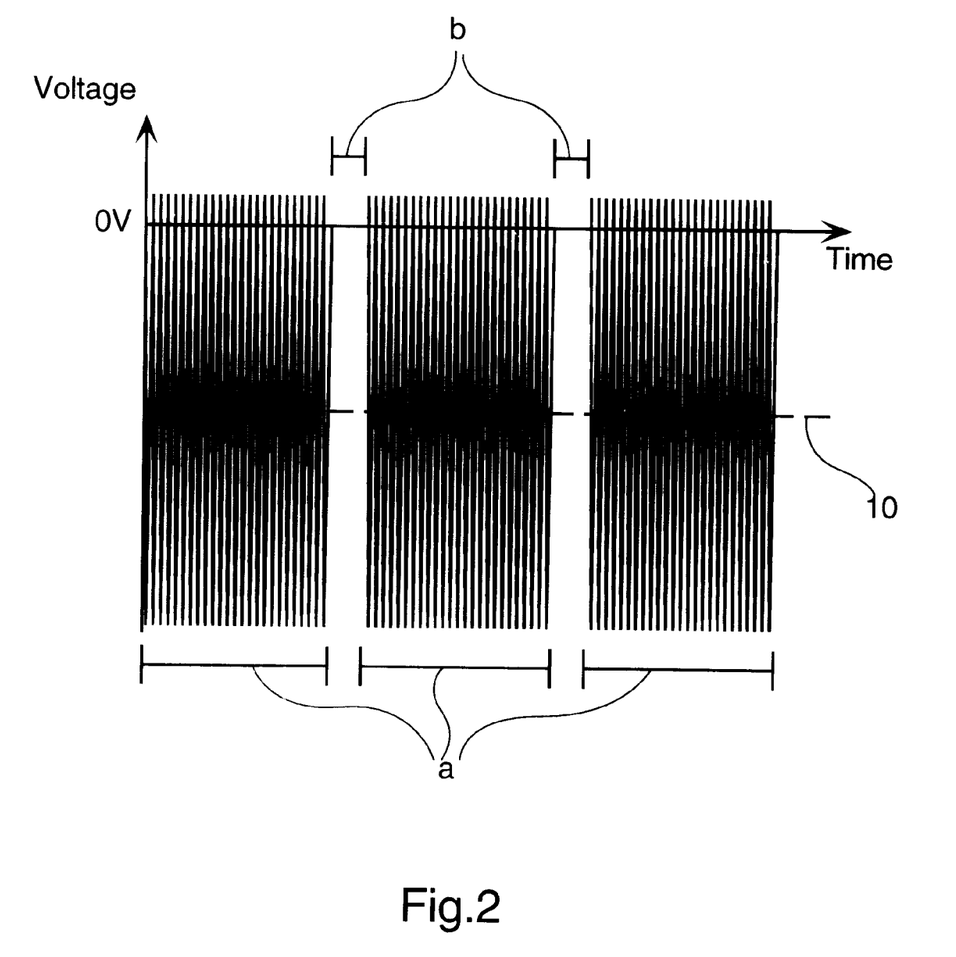
FIG. 2 is a diagram of the waveform of the voltage applied to the target in the first embodiment of the present invention.

The present invention offers a way to manufacture thin films that differ from the aforementioned conventional combined RF-DC magnetron sputtering. In particular, the power to the target 111 in the present embodiment is supplied intermittently by synchronizing the power from the RF power source 131 and DC power source 141 and periodically stopping it for the desired time at the respective power densities, for example, 1.5 and 0.5 W/cm$^2$, based on the control device 151. FIG. 2 shows the waveform of the voltage applied to the target 111 at this time. In FIG. 2, a is the period in which the 13.56 MHz RF power and DC power is supplied, and b is the period in which the RF and DC power supply is interrupted. The time of the supply period a is 5 msec, and the time of the interrupt period b is 1 msec. The dotted line 10 in FIG. 2 is the mean voltage of the target in period a, i.e., the Vt in period a. FIG. 2 visually depicts the fact that the period a is an alternating waveform. There is no direct correlation between the number of waves and time.

When the supply of power from the RF power source 131 and DC power source 141 to the target 111 is set up under the aforementioned conditions, no tracking arc is produced, which allows stable discharge to be produced for several tens of hours or more. ITO transparent conductive films can thus be consistently manufactured.

In the aforementioned embodiment, long-lasting stable discharge can be achieved without producing a tracking arc because the 5 msec for the power supply period a is sufficiently shorter than the time until a tracking arc is produced. As a result, there is not enough time for the cluster growth to produce a tracking arc. Furthermore, the 1 msec for the interrupt period b is enough time to reduce the plasma density, and is enough time to scatter the clusters that have grown within the time of the power supply period a.

In the aforementioned example, the time of the period a for supplying power was 5 msec, but the supply time should be shorter than the time needed for a tracking arc to be produced. Based on the results of the aforementioned conventional combined RF-DC magnetron sputtering, the time for which power is supplied can be set for a maximum of about 2 sec when the power supplied from the RF power source 131 and DC power source 141 have a power density of 1.5 W/cm$^2$ and 0.5 W/cm$^2$, respectively. However, when the supplied power is higher, the plasma density is increased, and the clusters grow more rapidly. The time needed for a tracking arc to be produced is thus shorter. Under conditions where the magnetic intensity at the target surface is greater or the film depositing pressure is lower, or when there are more nodules on the target surface, a tracking arc is produced in less time, sometimes in about 1 sec, depending on the process conditions or the state of the target surface area. For practical purposes, the time for the power supply period a should accordingly be set on the order of several msec as in the present example, and at most on the order of 100 msec.

The time for the power supply interrupt period b is also not limited to the 1 msec in the aforementioned embodiment. The power supply interrupt period should scatter the clusters grown within the time for the supply period a, and may be more or less than 1 msec. However, it is better to lower the plasma density sufficiently to scatter clusters. Therefore, the time should be set to at least 1 msec, where the plasma density is virtually zero upon stopping the power supply.

Figure 3:
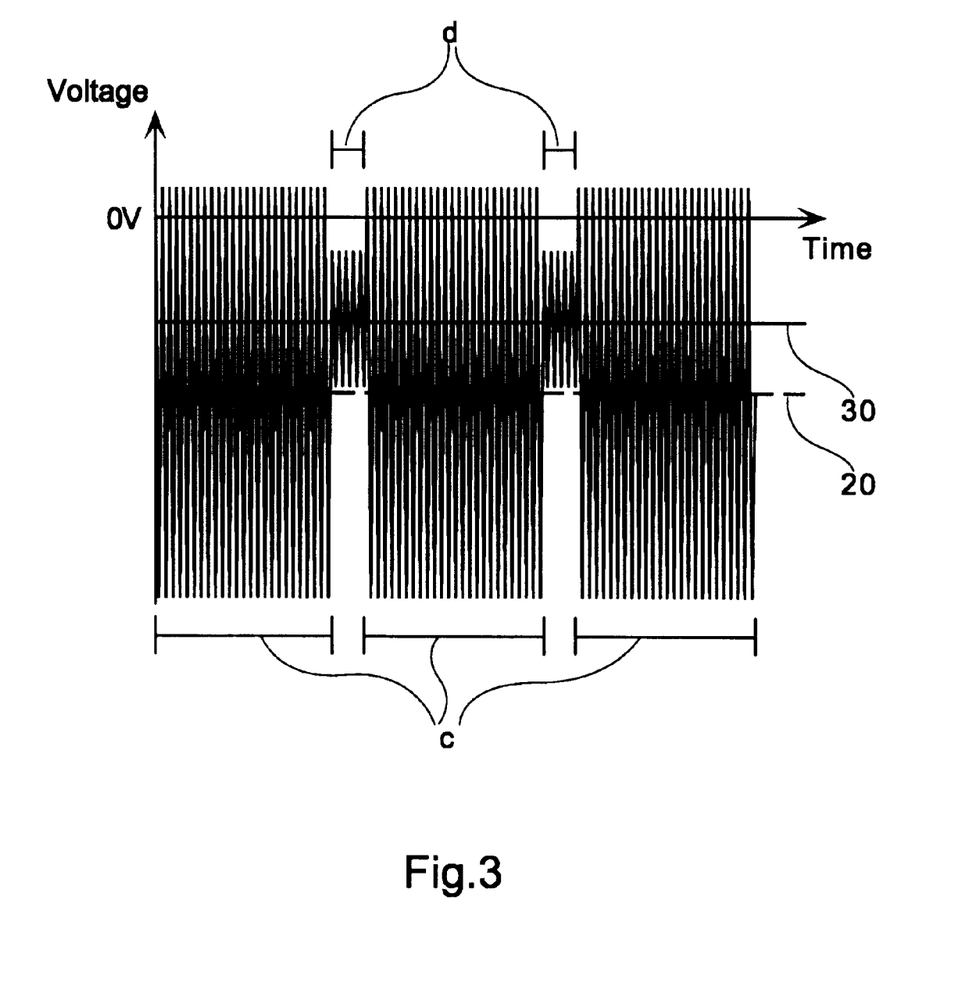
FIG. 3 is a diagram of the waveform of the voltage applied to the target in the second embodiment of the present invention.

A second embodiment of the present invention is described below. The structure and conditions of this embodiment are the same as those in the first embodiment, except for the mode of the power supply. In this embodiment, the RF and DC power supplied to the target are synchronized and periodically reduced. FIG. 3 depicts the waveform of the voltage applied to the target 111 in the present embodiment. Symbol c in FIG. 3 is the period of ordinary power supply, and d is the period in which the power is periodically reduced. In period c, the RF and DC power have a power density of 1.5 and 0.5 W/cm$^2$, respectively, with a time of 5 msec. In period d, the RF and DC power have a power density of 0.3 and 0.1 W/cm$^2$, respectively, with a time of 1 msec. The dotted line 20 and dashed line 30 in FIG. 3 indicate the mean voltage for the target in periods c and d, respectively, i.e., is, the Vt in each period. FIG. 3 visually depicts the fact that the periods c and d are alternating waveforms. There is no direct correlation between the number of wave and time.

In the present embodiment, no tracking arc is produced, and a stable discharge can be produced for several tens of hours or more, thereby allowing ITO transparent conductive films to be consistently manufactured. The power supply is not completely interrupted in the mode of power supply in the present embodiment, allowing stable discharge to be maintained without producing a tracking arc or stopping the discharge, even when the film depositing pressure is lower than the initiation pressure of discharge.

Long-lasting stable discharge can be achieved without producing a tracking arc in the present embodiment because, for example, as explained in the first embodiment, the 5 msec of the period c in which the RF and DC power are supplied at a power density of 1.5 W/cm$^2$ and 0.5 W/cm$^2$, respectively, is sufficiently shorter than the time needed for a tracking arc to be produced, and the cluster growth is not enough to result in a tracking aid. Another reason is that the plasma density during the power supply in period d (RF power density of 0.3 W/cm$^2$ and DC power density of 0.1 W/cm$^2$) is low enough to suppress cluster growth and to allow clusters which have been produced within the time of period c to be scattered, and that the time of 1 msec in period d is enough time to reduce the plasma density (stable plasma density during power supply in period d).

In the present embodiment, the time in the period c for the supply of ordinary power was 5 msec, but the time for the supply period c should be shorter than the time needed for the tracking arc to be produced. The time in period c for supplying ordinary power can be set to a maximum of about 2 sec, in the first embodiment. However, as noted above, a tracking arc is sometimes produced in about 1 sec, depending on the process conditions or the state of the target surface area. For practical purposes, the time for the power supply period c should accordingly be set on the order of msec as in the present embodiment, and at most on the order of 100 msec.

In the period d for synchronizing and periodically reducing the power in the present embodiment, the RF power was set to a power density of 0.3 W/cm$^2$, while the DC power was set to a power density of 0.1 W/cm$^2$, and the time was set to 1 msec. The numerical values, however, are not so limited. During the period d in which the power is synchronized and periodically reduced, the cluster growth should be suppressed, and the clusters which have grown within the time of the period c when the ordinary power is supplied should be scattered. The power may be higher than the aforementioned power, and the time may be shorter than 1 msec. When the power in the period d is higher, far from being suppressed and scattered, the clusters might grow, resulting in a tracking arc. Thus, for practical purposes, the power should be set at about the minimum power allowing discharge to be maintained. In the present embodiment, the power supply is not completely interrupted as it was in the first embodiment, so the time in period d should be at least 1 msec, where the plasma density falls, so as to ensure that the plasma density is lowered enough to scatter clusters which have grown during period c.

A third embodiment of the present invention is described below. The structure and conditions of this embodiment are the same as those in the first and second embodiments except for the mode of power supply.

Figure 4:
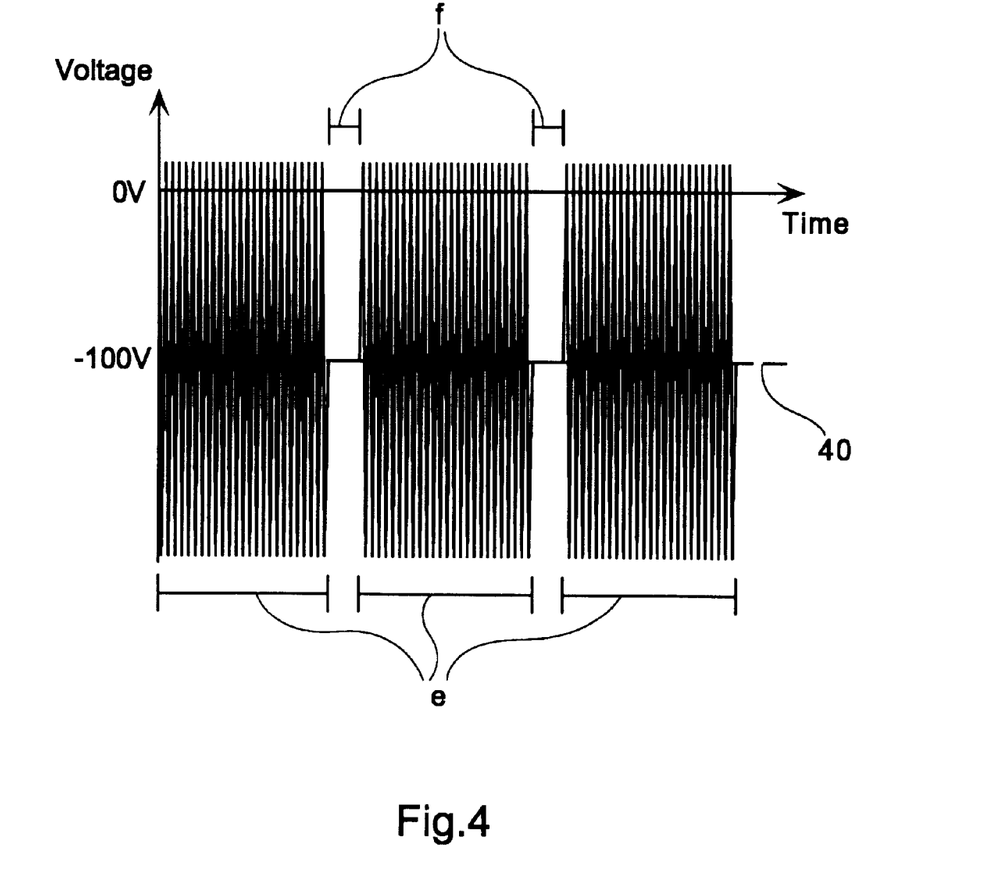
FIG. 4 is a diagram of the waveform of the voltage applied to the target in the third embodiment of the present invention.

It was found that discharge could not be maintained at or below −280 V (the lower absolute value) because of the current-voltage properties in discharge with DC power alone. In the present embodiment, a constant voltage regulated power source is used as the DC power source 141 shown in FIG. 1. The set voltage of the constant voltage regulated power source is set at no more than the voltage needed to maintain discharge (the lower absolute value), for example, −100 V, during discharge by DC power alone, and the power supply from the RF power source 131 is periodically stopped for a constant time, based on the control device 151. FIG. 4 depicts the waveform of the voltage applied to the target 111 in the present embodiment. The symbol e in FIG. 4 is the period in which RF power is supplied with controlling the voltage of the constant voltage regulated power source, and f is the period in which the RF power supply is periodically interrupted. A voltage of −100 V (dotted line 40) is applied from the constant voltage regulated power source. The RF power during period e has a power density of 1.5 W/cm$^2$, with a time of 5 msec, and the time during period f is 1 msec. FIG. 4 visually depicts the fact that the period e is an alternating waveform. There is no direct correlation between the number of waves and time.

In this embodiment, discharge cannot be maintained during period f because no RF power is supplied and no power is supplied even though voltage is applied from the constant voltage regulated power source. The RF power supply is periodically interrupted, so as to provide a period in which power is supplied to the target 111 for discharge, and a period in which the power supply is interrupted to stop the discharge, thereby suppressing the growth of clusters and scattering them. In the present embodiment, the discharge is intermittent just as in the first embodiment, allowing stable discharge to be produced for several tens of hours or more without producing a tracking arc. As a result, ITO transparent conductive films can be consistently manufactured.

In the present embodiment, −100 V voltage is applied from the constant voltage regulated power source, but the voltage should be lower than the voltage needed to sustain discharge when discharge is effected by the supply of DC power alone. The RF power and the time in period e as well as the time in period f in the present embodiment are not limited to the values used in the present embodiment. However, as noted in the description for the first embodiment, the process conditions and the state of the target surface are related to the production of a tracking arc. For practical purposes, the time in period e should accordingly be set on the order of msecs as in the present embodiment, and at most on the order of 100 msec. The time in period f should be at least 1 msec, so as to allow the plasma density to be lowered sufficiently.

Figure 5:
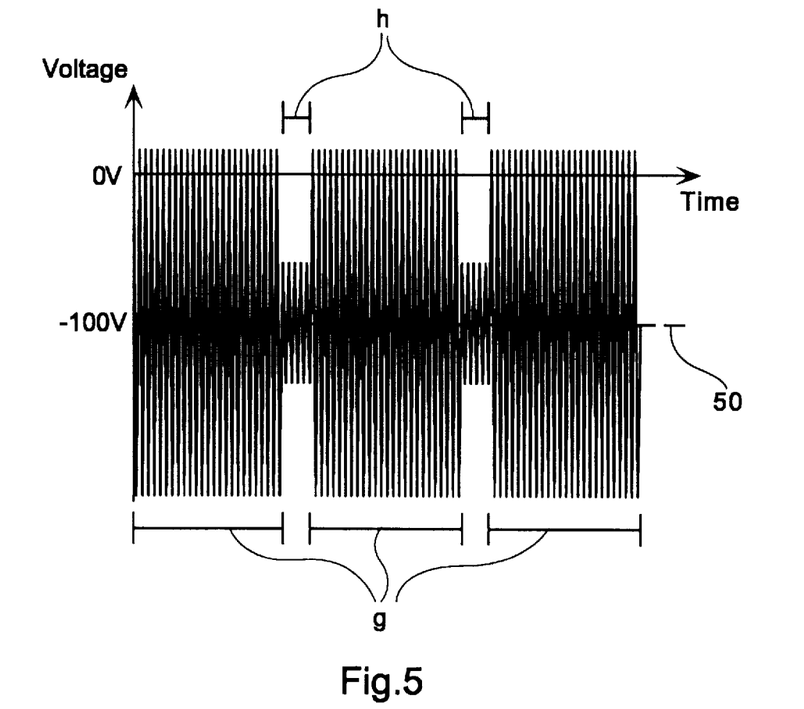
FIG. 5 is a diagram of the waveform of the voltage applied to the target in the fourth embodiment of the present invention.

A fourth embodiment of the present invention is described below. The structure and conditions of this embodiment are the same as those in the first to third embodiments except for the mode of power supply. In the present embodiment, a constant voltage regulated power source is used as the DC power source 141, as in the third embodiment. The set voltage of the constant voltage regulated power source is set to no more than the voltage needed to maintain discharge (the lower absolute value), for example, −100 V (dotted line 50), during discharge by DC power alone. However, unlike the third embodiment, the RF power is periodically reduced, rather than being periodically stopped, in the present embodiment. FIG. 5 depicts the waveform for the voltage applied to the target 111 in the present embodiment. The symbol g in FIG. 5 is the period in which RF power is supplied with controlling the voltage of the constant voltage regulated power source, and h is the period in which the RF power supply is periodically reduced with controlling the voltage of the constant voltage regulated power source. The RF power during period g has a power density of 1.5 W/cm, with a time of 5 msec, and the RF power during period h has a power density of 0.3 W/cm, with a time of 1 msec. FIG. 5 visually depicts the fact that the period g is an alternating waveform. There is no direct correlation between the number of waves and time.

In the present embodiment, the plasma density can be lowered because the RF power is reduced in period h. As a result, the growth of clusters can be suppressed, and they can be scattered. A period is thus established to periodically reduce the plasma density so as to suppress the growth of clusters and scatter them in the same manner as in the second embodiment. Stable discharge can be produced for several tens of hours or more without producing a tracking arc in the present embodiment. As a result, ITO transparent conductive films can be consistently manufactured.

In the present embodiment, −100 V voltage is applied from the constant voltage regulated power source. This voltage however, should be lower than the voltage needed to maintain discharge during discharge by supply from a DC power source alone, and is not limited to that in the present embodiment. The RF power and time in period g as well as the RF power and time in period h of the present embodiment are not limited to those in the present embodiment. However, as noted in the description for the first and second embodiments, the process conditions and the state of the target surface are related to the production of a tracking arc. For practical purposes, the time in period g should accordingly be set on the order of msecs as in the present embodiment, and at most on the order of 100 msec. The time in period h should be at least 1 msec, so as to allow the plasma density to be lowered sufficiently.

The aforementioned embodiments were examples in which ITO transparent conductive films were manufactured by combined RF-DC magnetron sputtering using targets consisting of sinters (95% density) obtained by the addition of 10 wt % $SnO_2$ to $In_2O_3$. The target materials, however, are not limited to those used in the aforementioned embodiments. The combined RF-DC magnetron sputtering method pertaining to the present invention can also be used for targets in which different amounts of $SnO_2$ have been added for the manufacture of similar ITO transparent films, or the targets may be pressed instead of sintered, or they may have different densities. The sputtering gas or the film depositing conditions including the film depositing pressure and magnetic field intensity are not limited to those in the present embodiment. For example, the sputtering gas may not only be argon, but also other rare gases, or mixtures thereof with reactive gases such as $O_2$. The combined RF-DC magnetron sputtering method pertaining to the present invention can be used under film depositing conditions that are different from those in the present embodiments.

The matter of a tracking arc produced during the manufacture of GeSbTe phase change type recording films by combined RF-DC magnetron sputtering using Ge, Sb, and Te compound targets is similar to that in the manufacture of ITO transparent conductive films noted in the present embodiments. The method pertaining to the present invention can also be used in such cases to prevent a tracking arc and to ensure the consistent manufacture of thin films.

The oscillating frequency of RF power source in the aforementioned embodiments was the generally 13.56 MHz, but the frequency is not so limited. The combined RF-DC magnetron sputtering pertaining to the present invention can also be used for RF of 1 MHz or higher. Although a tracking arc is produced at 27.12 MHz, 40.68 MHz, and 100 MHz in conventional methods, for example, the method of the present invention can be used to prevent a tracking arc from being produced, and thin films can be consistently manufactured.

Figure 1:
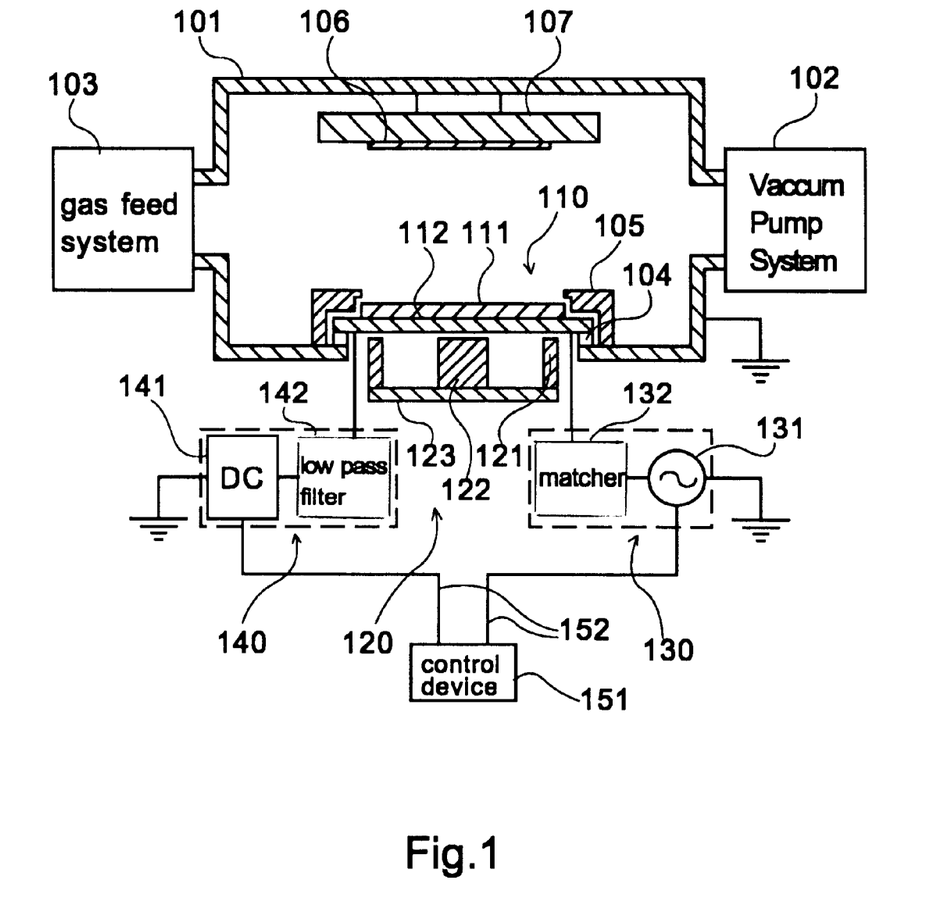
FIG. 1 schematically depicts the structure of a combined RF-DC magnetron sputtering device with which the combined RF-DC magnetron sputtering method pertaining to the present invention is implemented.

The aforementioned embodiments were examples of the manufacture of films on substrates statically facing the target, as shown in FIG. 1. The positional relationship between the target and substrate, however, not limited to that in the present embodiments. For example, the combined RF-DC magnetron sputtering pertaining to the present invention can also be used for in-line film manufacture where films are deposited on a substrate continuously moving across the front of a target. The method for manufacturing ITO transparent conductive films in the present invention can also be used in film deposited methods where one or more magnets placed behind the target are swung or eccentrically rotated in order to sputter the whole area of the target surface.

In the aforementioned embodiments, the power supplied to the target 111 was controlled using the structure depicted in FIG. 1, but the structure of the system for supplying power to the target 111 is not no limited. Any structure allowing the method of the present invention to work can be used. For example, a switching circuit for controlling the supply of DC power may be installed between the DC power source 141 and the low pass filter 142, and this may be controlled by the control device 151. If the control device is housed inside the RF power source 131, the aforementioned switching circuit may also thus be controlled.

MERITS OF THE INVENTION

As described above, the present invention is a combined RF-DC magnetron sputtering method, wherein RF and DC power are simultaneously supplied, and the RF and DC power supply is simultaneously interrupted before a tracking arc is produced, so as to scatter clusters that have been produced during the supply of power. This is periodically repeated. The present invention thus allows a tracking arc to be prevented, thereby ensuring the consistent manufacture of thin films.

As an alternative to the simultaneous and periodical interruption of RF and DC power supply, the RF and DC power can be periodically reduced simultaneously, so as to prevent a tracking arc from being produced when clusters, that have been produced before the power is reduced, are scattered, thereby allowing thin films to be consistently manufactured. Since the discharge is not interrupted, stable discharge can be preserved without producing a tracking arc, even when the pressure is lower than the initiation pressure of discharge.

A constant voltage regulated power source can be used for the DC power source, and the set voltage can be set lower than the voltage needed to maintain discharge during discharge by DC power alone, so that discharge can be produced and interrupted by the supply and interruption of RF power. After RF power has been supplied, the supply of RF power is interrupted before a tracking arc is produced, and discharge is stopped, allowing clusters that have been produced during the supply of power to be scattered. This can be repeated periodically to prevent a tracking arc from being produced and to ensure the consistent manufacture of thin films.

A constant voltage regulated power source can be used for the DC power source, and the set voltage can be set lower than the voltage needed to maintain discharge during discharge by DC power alone. In this state, the RF power can be periodically reduced so as to scatter clusters that have been produced before the power was reduced. A tracking arc can be prevented from being produced, so as to ensure the consistent manufacture of thin films. Since the discharge is not stopped, stable discharge can be preserved without producing a tracking arc, even when the pressure is lower than the initiation pressure of discharge.

It will be appreciated that the present invention may take various forms, and is not confined to the specific details of the preferred embodiments. The foregoing specification is illustrative, and the scope of the present invention is to be determined with reference to the following claims.

What is claimed is:

1. A combined RF-DC magnetron sputtering method, in which magnets are placed behind a target, RF and DC power are simultaneously supplied to said target to produce a plasma, and sputtering is used to form a thin film on a substrate facing said target, comprising the steps of:

simultaneously and periodically stopping the supply of said RF power and DC power to said target for a first period of time, wherein said RF and DC power is supplied for a second period of time which is shorter than a period of time needed for a tracking arc to be produced, wherein the stopping and supplying of said RF power and DC power are synchronized and wherein said second period of time for supplying said RF and DC power is greater than the first period of time for stopping said RF and DC power.

2. A combined RF-DC magnetron sputtering method as defined in claim 1 wherein said power supply is stopped for at least 1 millisecond.

3. The method of claim 1 wherein said first period of time is approximately 1 ms.

4. A combined RF-DC magnetron sputtering method, in which magnets are placed behind a target, RF and DC power are simultaneously supplied to said target to produce a plasma, and sputtering is used to form a thin film on a substrate facing said target, comprising the steps of:

establishing a first period of time for simultaneously and periodically reducing said RF power and DC power supplied to said target, wherein said RF and DC power is supplied, without being reduced, for a second period of time which is shorter than a period of time needed for a tracking arc to be produced, wherein the reducing and supplying of said RF power and DC power are synchronized and wherein said second period of time for supplying said RF and DC power is greater than the first period of time for reducing said RF and DC power.

5. A combined RF-DC magnetron sputtering method as defined in claim 4 wherein said power supply is reduced for at least 1 millisecond.

6. The method of claim 4 wherein said first period of time is approximately 1 ms.

7. A combined RF-DC magnetron sputtering method, in which magnets are placed behind a target, RF and DC power are simultaneously supplied to said target to produce a plasma, and sputtering is used to form a thin film on a substrate facing said target, comprising the steps of:

providing a constant voltage regulated power source for a DC power source supplying said DC power to said target, adjusting a set voltage of the constant voltage regulated power source to lower than the voltage needed to maintain discharge during discharge by DC power alone, and periodically stopping the supply of said RF power to said target for a first period of time, wherein said RF power supply is supplied for a second period of time which is shorter than a period of time needed for a tracking arc to be produced and wherein said second period of time for supplying said RF power is greater than the first period of time for stopping said RF power.

8. A combined RF-DC magnetron sputtering method as defined in claim 7 wherein said RF power supply is stopped for at least 1 millisecond.

9. The method of claim 7 wherein said first period of time is approximately 1 ms.

10. A combined RF-DC magnetron sputtering method, in which magnets are placed behind a target, RF and DC power are simultaneously supplied to said target to produce a plasma, and sputtering is used to form a thin film on a substrate facing said target, said combined RF-DC magnetron sputtering method comprising the steps of:

providing a constant voltage regulated power source for a DC power source that supplies said DC power to said target, setting a voltage of the constant voltage regulated power source to lower than the voltage needed to maintain discharge during discharge by DC power alone, and establishing a period for periodically reducing said RF power supplied to said target for a first period of time, wherein said RF power is supplied, without being reduced, for a second period of time which is shorter than a period of time needed for a tracking arc to be produced and wherein said second period of time for supplying said RF power is greater than the first period of time for reducing said RF power.

11. A combined RF-DC magnetron sputtering method as defined in claim 10 wherein said RF power supply is reduced for at least 1 millisecond.

12. The method of claim 10 wherein said first period of time is approximately 1 ms.

\* \* \* \* \*